United States Patent [19]

Kawashima

[11] Patent Number: 5,055,794
[45] Date of Patent: Oct. 8, 1991

[54] STATIC INDUCTION ELECTRIC APPARATUS

[75] Inventor: Takeshi Kawashima, Ako, Japan

[73] Assignee: Mitsubishi Denki Kabushiki Kaisha, Tokyo, Japan

[21] Appl. No.: 300,847

[22] Filed: Jan. 24, 1989

[30] Foreign Application Priority Data

Jan. 27, 1988 [JP] Japan .................................. 63-14691

[51] Int. Cl.⁵ .......................................... G01N 27/60
[52] U.S. Cl. .................................. 324/453; 324/553; 324/457
[58] Field of Search ............... 324/453, 454, 457, 547, 324/553

[56] References Cited

U.S. PATENT DOCUMENTS

| | | | |
|---|---|---|---|
| 3,753,102 | 8/1973 | Beck | 324/453 |
| 4,194,148 | 3/1980 | Ohkubo | 324/453 |
| 4,592,240 | 6/1986 | McHale | 324/453 |
| 4,607,228 | 8/1986 | Reif | 324/453 |
| 4,873,489 | 10/1989 | Melcher et al. | 324/453 |

FOREIGN PATENT DOCUMENTS

| | | |
|---|---|---|
| 932446 | 8/1973 | Canada . |
| 53-139124 | 5/1978 | Japan . |
| 56-31633 | 3/1981 | Japan . |
| 56-125675 | 10/1981 | Japan . |

OTHER PUBLICATIONS

"Partial Discharge Automatic Monitor for Oil-Filled Power Transformer", pp. 422-428, vol. PAS-103, No. 2, 2-2-84.
"Static Induction Equipment", p. 125 E87, vol. 3, No. 10, JP-A-53139124, 1-29-79, Patent Abstract of Japan (Hitachi Seisakusho K.K.).
"Method For Measurement of Electrostatic Charged Quantity of Insulating Oil in Forced Oil Electrical Apparatus", pp. 95 [874] vol. 5, No. 202, 12-22-81, JP-A-56 125675 (Meidensha K.K.).
Electrical Insulation and Dielectric Phenomena, pp. 246-256, "Partial Discharge Automatic Monitor for Oil for Large Power Transformers", Leda et al., Claymont, Del., 2nd-6th Nov. 1986.

Primary Examiner—Kenneth Wiedner
Assistant Examiner—Maura K. Regan
Attorney, Agent, or Firm—Leydig Voit & Mayer

[57] ABSTRACT

A static induction electric apparatus includes an oil tank, an electrical winding assembly, an insulating oil for cooling and insulating the winding, and a circulating pump. A sensor electrode having a measurement surface for providing an electrical signal indicative of the amount of the electric charge in the insulating oil is supported on the oil tank by a support assembly in such a relationship that the measurement surface of the sensor electrode is electrically insulated from and substantially flush with the inner surface of the oil tank. The distance between the sensing surface of the electrode and the inner surface of the oil tank is large enough to electrically insulate the two from one another but small enough to keep the electric field around the sensor electrode free of substantial disturbances.

1 Claim, 4 Drawing Sheets

STATIC INDUCTION ELECTRIC APPARATUS

BACKGROUND OF THE INVENTION

This invention relates to a static induction electric apparatus such as a transformer, a reactor or the like and, more particularly, to a static induction electric apparatus having a device for detecting the amount of build-up of the electrostatic charge generated by the electrostatic flow charging phenomenon.

FIG. 1 is a view showing the internal structure of a typical static induction electric apparatus such as a conventional transformer.

In the figure, reference numeral 1 is a winding assembly composed of a winding and an electrical insulation, 2 is an iron core of the winding assembly 1, 3 is an oil tank containing the above components and filled with an electrically insulating oil, 4 is an oil circulating pump for circulating the insulating oil 4, 5 is a conduit for circulating the oil, 6 is an insulating oil filled within the oil tank 3, the above components constituting the static induction electric apparatus.

Due to the electrostatic flow charging phenomenon ocurring at the interface between the solid insulating material on the winding assembly 1 and the insulating oil, there is positively charged insulating oil 6 which has positive charges 7 within the oil tank 3 above the winding assembly 1 and there are negative charges 8 on the solid insulating material below the winding assembly 1.

FIG. 2 illustrates the upper space within the oil tank 3 shown in FIG. 1 in which a positive charge cloud 9 is formed by the insulating oil 6 having the positive charges 7, and an electric signal 10 flowing into the oil tank 3 and an equipotential line 11 which are caused by the positive charge cloud 9 are also shown.

As shown in FIG. 1, a negative charge cloud 12 is similarly generated in the insulating oil 6 within the oil tank 3 by the negative charges 8.

In a static induction electric apparatus having the conventional forced oil circulating system composed of the oil circulating pump 4 and its piping 5, the electrostatic flow charging phenomenon, which occurs due to the solid insulating material of the winding assembly 1 and the insulating oil. flowing at its interface, causes the positive charge cloud 9 in the positively charged insulating oil 6 to accumulate in the upper portion of the oil tank 3 or the negative charge cloud 12 having the negative charges 8 to accumulate on the solid insulating material on the lower side or the upstream side with respect to the oil flow of the winding assembly 1. In order to limit the above accumulated amount to be equal to or less than a predetermined amount, the circulating flow rate of the insulating oil had to be designed to the lower than a prescribed value, or some additives such as BTA disclosed in Japanese Patent Laid-Open No. 53-19800 for supressing the generation of static electricity in the insulating oil 6 must be used.

As the electric charge of the positive charge cloud 9 accumulated in the upper oil tank 3 and the negative charge cloud 12 accumulated on the solid insulating material in the lower portion become large, the electric field generated by these electric charges or the electric field overlapping the electric field generated by the electric components exceeds the insulating level of the insulating oil 6 and the soild insulating material, often resulting in insulating breakdown.

Thus, in the conventional static induction electric apparatus in which an oil circulating pump 4 is provided and the electrostatic flow charging phenomenon occurs at the interface between the solid insulating material of the winding assembly 1 and the insulating oil, the positive charges 7 accumulate in the upper space within the oil tank 3 and the negative charges selectively accumulate in the bottom of the oil tank 3. However, electric charge of the positive charge cloud 9 accumulated in the upper portion of the tank is not measured nor monitored. Therefore, there is always a danger of insulating breakdown, or the oil circulating rate must be limited to less than the desired rate.

SUMMARY OF THE INVENTION

Accordingly, one object of this invention is to provide a static induction electric apparatus in which the above-discussed problem of the conventional apparatus is solved.

Another object of the present invention is to provide a static induction electric apparatus arranged to measure an amount of electric space charge accumulated in the oil tank and the stationary parts and to regulate the charge so as to prevent the insulation breakdown within the static induction electric apparatus.

Another object of the present invention is to provide a static induction electric apparatus in which the structure of the sensor electrode is simple and reliable.

With the above objects in view, the static induction apparatus of the present invention comprises an oil tank, an electrical winding assembly, an insulating oil for cooling and insulating the winding, and a circulating pump. A sensor electrode having a measurement surface for providing an electrical signal indicative of the amount of the electric charge in the insulating oil is supported on the oil tank by a support assembly in such a relationship that the measurement surface of the sensor electrode is electrically insulated from and substantially flush with the inner surface of the oil tank. The distance between the sensing surface of the electrode and the inner surface of the oil tank is large enough to electrically insulate the two from one another but small enough to keep the electric field around the sensor electrode free of substantial disturbances.

According to the static induction electric apparatus of the present invention, the sensor electrode as well as the monitor device are provided for generating an alarm according to the signal indicative of the magnitude of the electric charge flowing into the sensor electrode, an electric signal emitted from the accumulated charge cloud is received and measured to generate an alarm when the measured value exceeds a predetermined value. Therefore, a dangerous state due to accumulated static electricity of the electrostatic induction electric apparatus can be immediately detected and an appropriate measure can be taken. Also, since the distance between the sensing surface of the electrode and the inner surface of the oil tank is large enough to electrically insulate the two from one another but small enough to keep the electric field around the sensor electrode free of substantial disturbances, there is no need to provide a guard electrode .

BRIEF DESCRIPTION OF THE DRAWINGS

The present invention will become more readily apparent from the following detailed description of the preferred embodiments of the present invention taken in conjunction with the accompanying drawings, in which.

DESCRIPTION OF THE PREFERRED EMBODIMENTS

Figure 1:
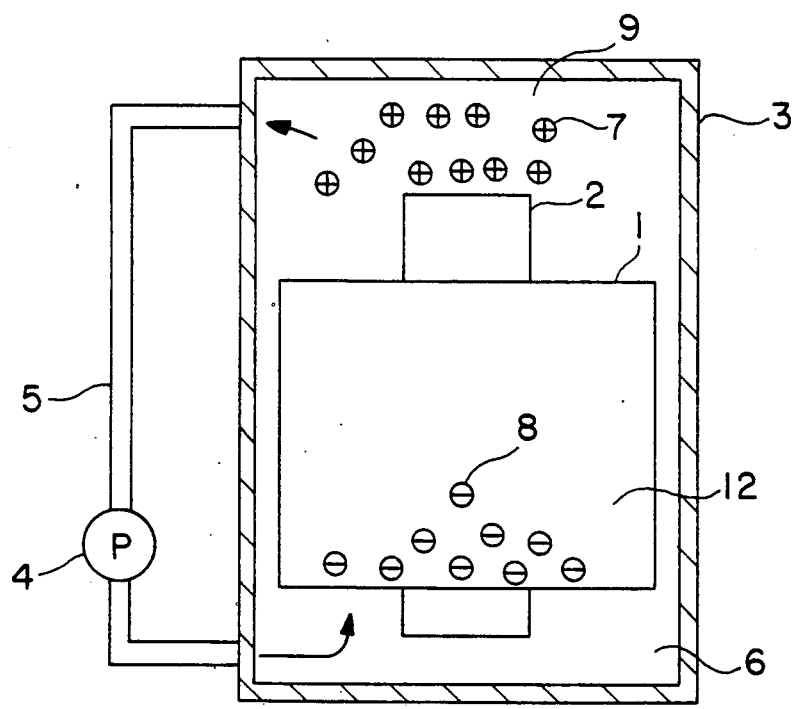
FIG. 1 is a schematic vertical sectional view of a conventional transformer.
Figure 2:
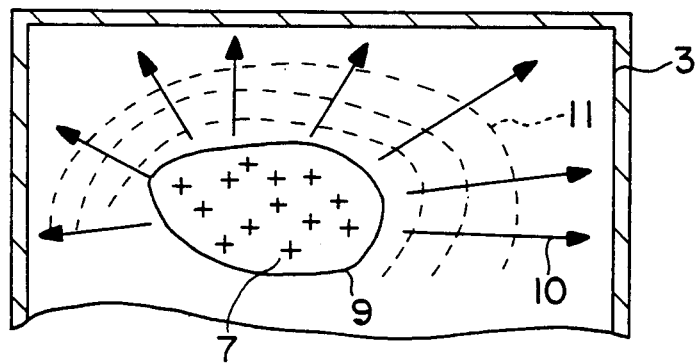
FIG. 2 schematically shows the electrical signal in the upper portion of the oil tank shown in FIG. 1.
Figure 3:
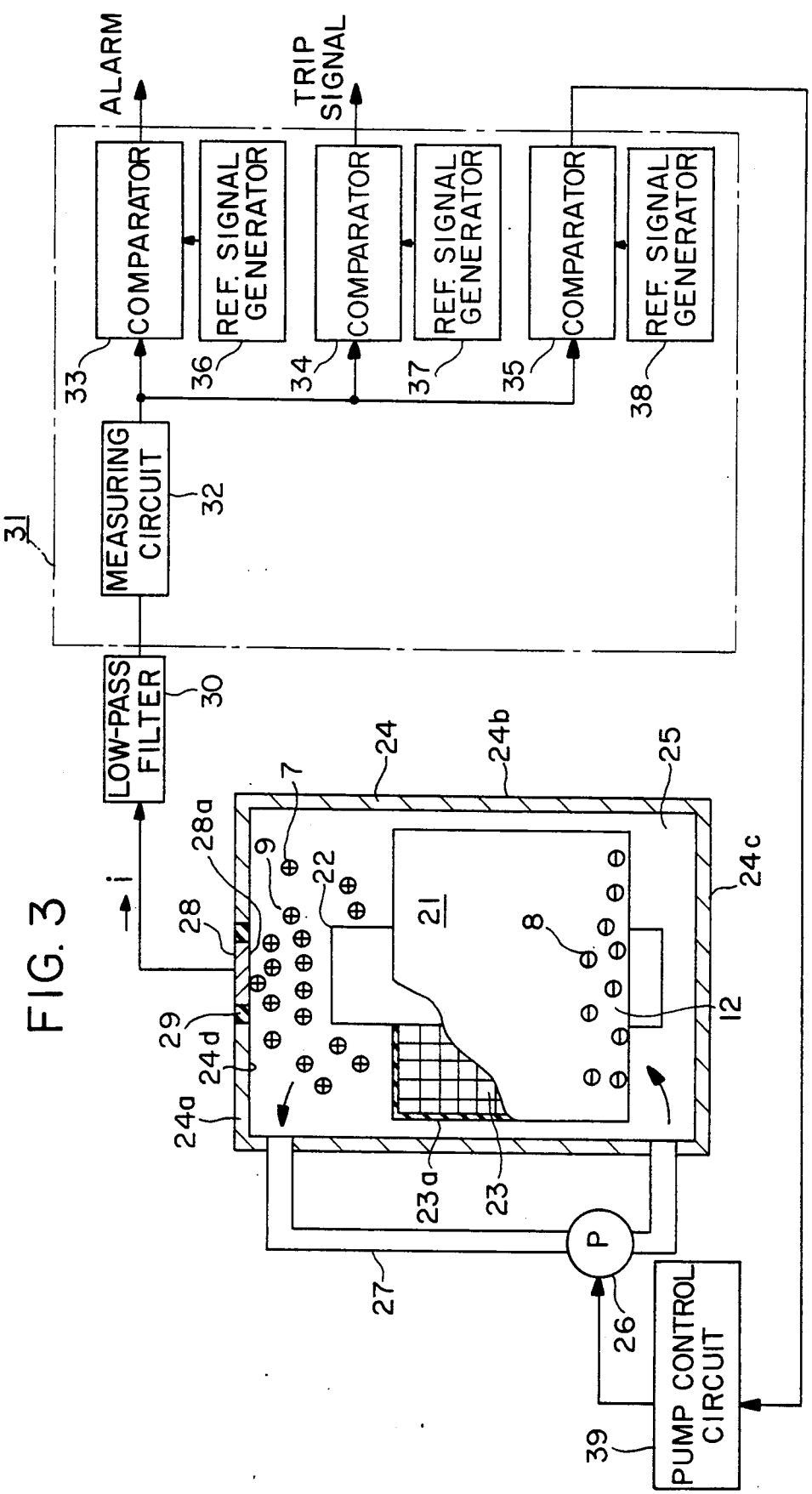
FIG. 3 is a schematic vertical sectional view of one embodiment of the static induction electric apparatus of the present invention.

FIG. 3 schematically illustrates one embodiment of invention the static induction electric apparatus of the present invention. It includes an electrical winding assembly 21 including an iron core 22, an electrical winding 23 wound on the iron core 22 and an electrical insulation 23a for electrically insulating the winding 23. The electrical winding assembly 21 is housed within an electrically conductive tank 24 having a top wall 24a, side walls 24b, and a bottom wall 24c. The interior space of the tank 24 is filled with an electrically insulating oil 25 for cooling and insulating the winding assembly 21. In order to efficiently cool the winding assembly 21 with the insulating oil 25, an oil pump 26 and a conduit 27 circulate the insulating oil through the oil tank 24 and through the electrical winding assembly 21.

According to the static induction electric apparatus of the present invention, the top wall 24a of the oil tank 24 is provided with a sensor electrode 28 having a measurement surface 28a electrically insulated from the top wall 24a and supported by an insulating support assembly 29. The sensor electrode 28 is connected through a low-pass filter 30 to a monitor 31 so that an electrical signal indicative of the magnitude of the electric charge 7 accumulated in the insulating oil 25 can be monitored. The low-pass filter 30 is provided for easy and simple measurement of the accumulated electric charge since there is generally an alternating electric field within the oil tank 24 of the static induction electric apparatus and the oil flow is complicated or there are many small disturbances.

Figure 4:
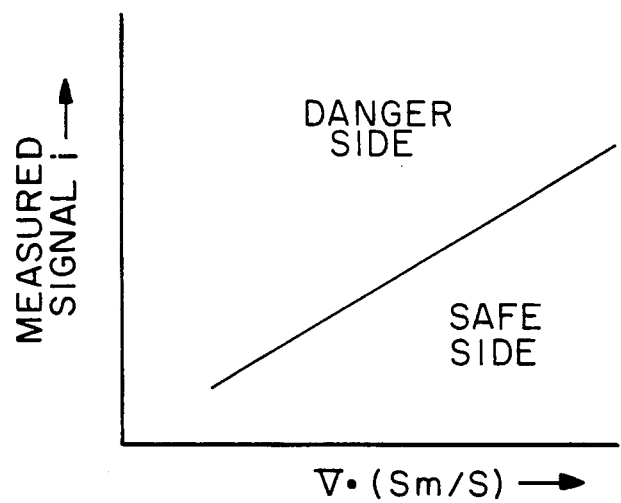
FIG. 4 is a graph showing the relationship of the measured electric signal with respect to the electrode area, the oil-filled space and the zero-potential surface area of the structural member.

The monitor 31 includes a measuring circuit 32 connected to each of first, second and third comparators 33, 34 and 35, respectively, each connected to first, second and third reference signal generators 36, 37 and 38, respectively. The level of the signal generated from each of the reference signal generators 36, 37 and 38 is determined from various factors including the area (Sm) of the measurement surface 28a of the sensor electrode 28, the volume (V) of the oil-filled space in which the space charge is presented and the surface area (S) of the structure surrounding the oil space such as the tank, the iron core and winding which is substantially at zero potential. The magnitude of the electric signal which flows into the sensor electrode 28 is proportional to the volume (V) of the oil space and the area (Sm) of the sensor electrode 28 and is inversely proportion to the zero potential area (S) of the structure. These relationships are illustrated in a graph shown in FIG. 4, in which the measured electric signal i is plotted against $V \cdot (Sm/S)$.

The first comparator 33 compares the detected electric signal from the filter 30 with a first reference signal of a predetermined level so as to generate an alarm signal when the detected signal exceeds the first reference signal. The second comparator 34 compares the detected electric signal from the filter 30 with a second reference signal of a second predetermined level so that output obtained from the second comparator 34 may be utilized as a trip signal. The third comporator 35 compares the signal from the measuring circuit 32 with a third reference signal generated from the third reference signal generating circuit 38 to provide a pump control signal. The pump control signal from the third comparator 35 is supplied to a pump control unit 39 to control the operation of the insulating oil circulating pump 26 according to the results of the measurement of the electric charge accumulated within the insulating oil 25 within the tank 24.

The insulating support assembly 29 supports the sensor electrode 28 from the top wall 24a of the oil tank 24 such that the measurement surface 28a of the sensor electrode 28 is electrically insulated from and substantially flush with the inner surface 24d of the top wall 24a of the oil tank 24. In the illustrated example, the inner surfaces of the tank top wall 24a, the insulating support assembly 29 and the sensor electrode 28 are all flush with each other, i.e., in a common plane. In this context, the sensor electrode 28 and the support assembly may be said to be an integral part of the top wall 24a of the oil tank 24. According to the present invention, the distance between the measurement surface 28a of the electrode 28 and the inner surface 24d of the top wall 24a of the oil tank 24 is large enough to electrically insulate the two from each other but small enough to keep the electric field around the sensor electrode 28 free of substantial disturbances which produce error signals in the sensor electrode 28.

In the static induction electric apparatus of the above-described construction, positive charges 7 accumulate in the upper portion of the oil tank 24 because an electrostatic flow charging phenomenon between the solid insulating material 23a of the winding assembly 21 and the insulating oil 25 forms a positive charge cloud 9 in the insulating oil 25 above the winding assembly 21. Therefore, an electric current signal generated from the positive charge cloud 9 is received by the sensor electrode 28, which is electrically insulated from other portion of the top wall 24a of the oil tank 24 by the insulating support assembly 29. As has been previously described, the magnitude of the electric signal received by the sensor electrode is measured and compared with predetermined reference signals in the measurement and comparison unit of the monitor 30 and an alarm signal and/or a pump control signal, etc. are generated when the measured signal exceeds the predetermined reference values, thereby immediately determining the existence of an abnormal condition of the static induction electric apparatus.

Figure 5:
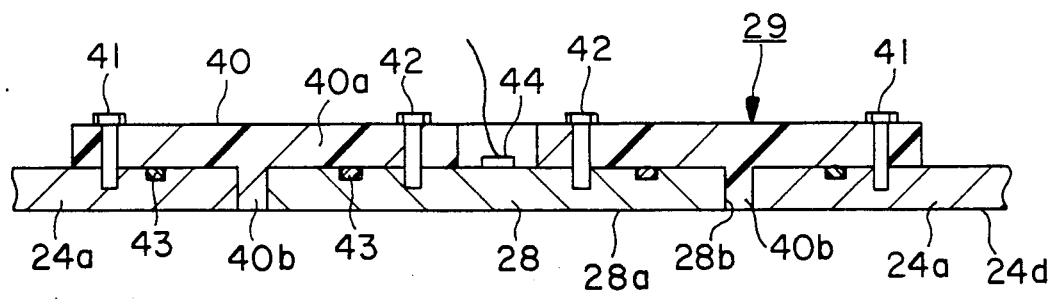
FIG. 5 is an enlarged sectional view of one embodiment of a sensor electrode for use in the arrangement shown in FIG. 3.

FIG. 5 illustrates the detailed structure of the insulating support assembly 29 for attaching the sensor electrode 28 to the top tank wall 24a. The tank wall 24a has formed therein a circular hole. A circular sensor electrode 28 having the same thickness as the tank wall 24a is loosely fitted into the hole to close it with an annular clearance 28b therebetween. The tank wall 24a and the sensor electrode 28 are rigidly secured together by the insulating support assembly 29 which comprises an electrically insulating annular member 40 and securing means such as bolts 41 and 42 for securely attaching the insulating support member 40 to the outer surfaces of the tank wall 24a and the sensor electrode 28, respectively. The insulating annular member 40 includes a base in the form of a disc 40a with a central hole in it and an annular flange 40b extending substantially inwardly into the annular clearance 28b defined between the circular edges of the tank wall 24a and the sensor electrode 28. The insulating support assembly 29 also comprises O-rings 43 fitted within annular grooves formed in the outer surface of the tank wall 24a. The annular flange 40b serves as a spacer for the sensor electrode 28 and also for making the inner surface of the tank wall 24a and the inner surface 28a of the sensor electrode 28 substantially continuous to define a smooth interior surface of the tank 24. An output terminal 44 is connected to the center of the sensor electrode 28. The distance between the measurement surface 28a of the electrode 28 and the inner surface 24d of the top wall 24a of the oil tank 24, which is the width of the ridge 28b, is selected to be large enough to electrically insulate the electrode 28 and the tank wall 24 but small enough to keep an electric field around the sensor electrode 28 free of substantial disturbances which produce error signals in the sensor electrode 28.

Figure 6:
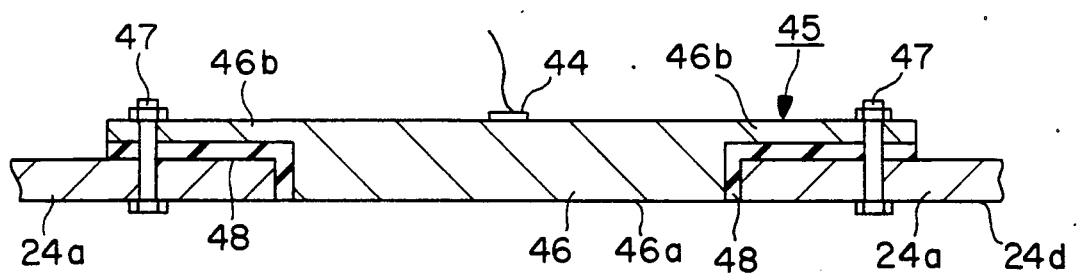
FIG. 6 is a sectional view similar to FIG. 6 but illustrating another embodiment.

FIG. 6 illustrates another embodiment of the insulating support assembly 45 in which a disc-shaped sensor electrode 46 having a measurement surface 46a is provided with a flange 46b that overlaps the tank wall 24a and is secured thereto by electrically insulating fastening bolts 47 extending through the flange 46b and the tank wall 24a. An electrically insulating member 48 is sandwiched between the tank wall 24a and the sensor electrode 28 in order to electrically insulate the two and form a liquid-tight sea. The electrically insulating member 28 in this embodiment has a cylindrical portion disposed between the sensor electrode 46 and the inner periphery of the opening in the tank wall 24a, and an annular portion which extends from the cylindrical portion between the flange 46b of the sensor electrode 45 and the outer surface of the tank wall 24a.

Figure 7:
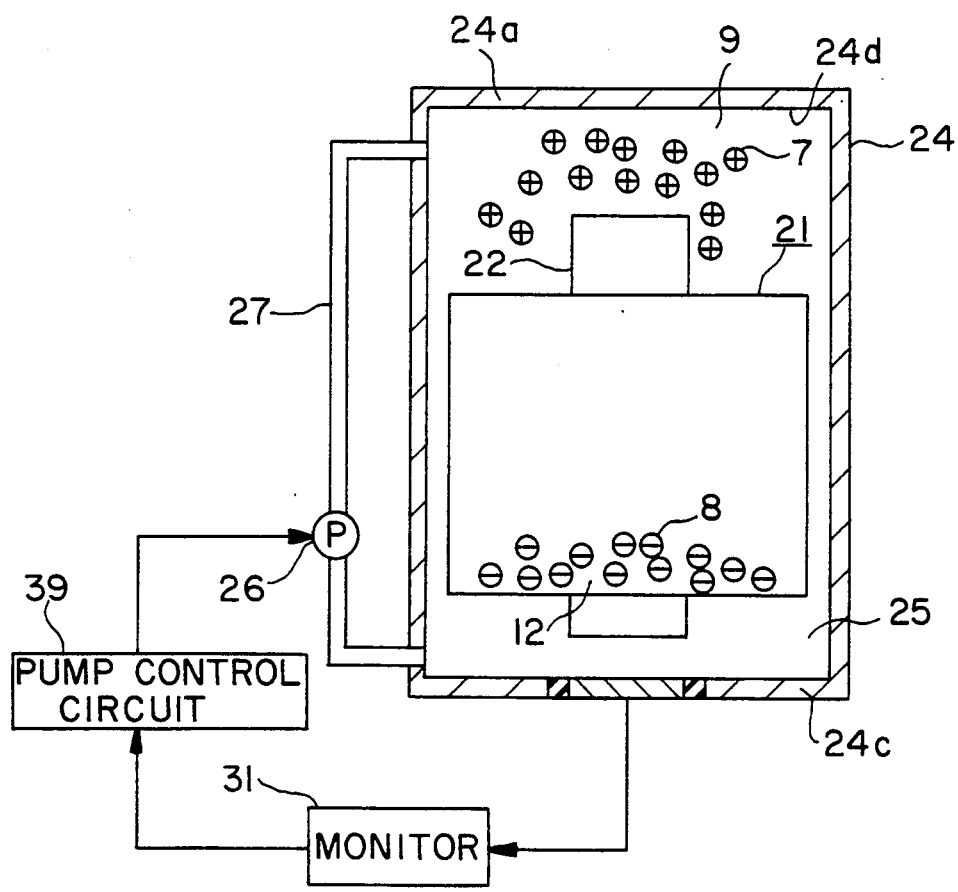
FIG. 7 is a schematic vertical sectional view of another embodiment of the present invention in which a sensor electrode is disposed in the bottom wall of an oil tank.

As shown in FIG. 7, while the electrically insulated sensor electrode 28 of the present invention is illustrated in FIG. 3 and described in terms of the measurement of the positive charge cloud 9 accumulated in the upper interior space of the oil tank 24, and therefore the sensor electrode 28 is attached to the top wall 24a of the tank 24, the negative charged cloud 12 generated due to the similar negative charged particles 8 formed on the solid insulating material below the winding assembly 21 can be measured and monitored by supporting and electrically insulating the sensor electrode 28 on the bottom wall 24c of the oil tank 24 adjacent to the bottom of the winding assembly 21 by means of the insulating support assembly 29.

While the present invention is applied to a transformer in the above description, this invention can be applied to other oil-filled electrical devices such as reactors or the like.

What is claimed is:

1. a static induction electric apparatus comprising:
   an electrical winding assembly including a winding and an electrical insulation for electrically insulating said winding;
   an insulating oil for cooling and insulating said winding;
   an oil tank having an inner surface and containing therein said winding assembly and said insulating oil;
   means for circulating said insulating oil through said tank for cooling said winding assembly;
   a sensor electrode having a measurement surface for detecting electric charge in said insulating oil and providing an electrical signal indicative of the amount of the electric charge in said insulating oil; and
   insulating support means for electrically insulatingly supporting said electrode from said oil tank in such a relationship that said measurement surface of said sensor electrode is electrically insulated from a substantially flush with said inner surface of said oil tank, and that the distance between said sensing surface of said electrode and said inner surface of said oil tank is large enough for electrically insulating therebetween but small enough for maintaining an electric field around said sensor electrode to be free of a substantial disturbance;
   said insulating support means comprising a flange extending from said sensor electrode in an overlapping relationship with respect to said tank wall, electrically insulating fastening means for connecting said flange of said sensor electrode and said tank wall, and an electrically insulating annular seal member disposed between said tank wall and said flange of said sensor electrode for electrically insulating and liquid-tightly sealing therebetween.

* * * * *

UNITED STATES PATENT AND TRADEMARK OFFICE
CERTIFICATE OF CORRECTION

PATENT NO. : 5,055,794

DATED : October 8, 1991

INVENTOR(S) : Takeshi Kawashima

It is certified that error appears in the above-identified patent and that said Letters Patent is hereby corrected as shown below:

Title page:

In item no. [56], Other Publications, one reference was omitted --IEEE Transactions on Power Apparatus and Systems, vol. 103, No. 2, Feb. 1984, pp. 422-428--.

Claim 1, column 6, line 34, change "a" to --and--.

Signed and Sealed this

Fifteenth Day of June, 1993

Attest:

MICHAEL K. KIRK

Attesting Officer

Acting Commissioner of Patents and Trademarks